United States Patent [19]

Amuro

[11] Patent Number: 5,329,280
[45] Date of Patent: Jul. 12, 1994

[54] ADJACENT CODE SYSTEM

[75] Inventor: Stephen Amuro, Middletown, R.I.

[73] Assignee: The United States of America as represented by the Secretary of the Navy, Washington, D.C.

[21] Appl. No.: 905,949

[22] Filed: Jun. 29, 1992

[51] Int. Cl.[5] ............................................. H03M 7/16
[52] U.S. Cl. ........................................ 341/96; 341/97; 341/98
[58] Field of Search .................. 341/96, 97, 98, 50

[56] References Cited

U.S. PATENT DOCUMENTS 4,618,849 10/1986 Bruestle .............................. 341/98
5,045,854 9/1991 Windmiller ........................ 341/97

Primary Examiner—Sharon D. Logan
Attorney, Agent, or Firm—Michael J. McGowan; Prithvi C. Lall; Michael F. Oglo

[57] ABSTRACT

A digital counting circuit, including a binary counter supplying output signals to an adjacent code encoder that processes the received signals and transmits its output to a binary decoder. The encoder has a plurality of D-type flip-flop devices to which selected outputs of the binary counter are connected. The circuit operates so that only one input change to the binary decoder is permitted for each change of count from the binary counter. This prevents any erroneous counts from momentarily appearing on the output lines of the binary decoder.

8 Claims, 3 Drawing Sheets

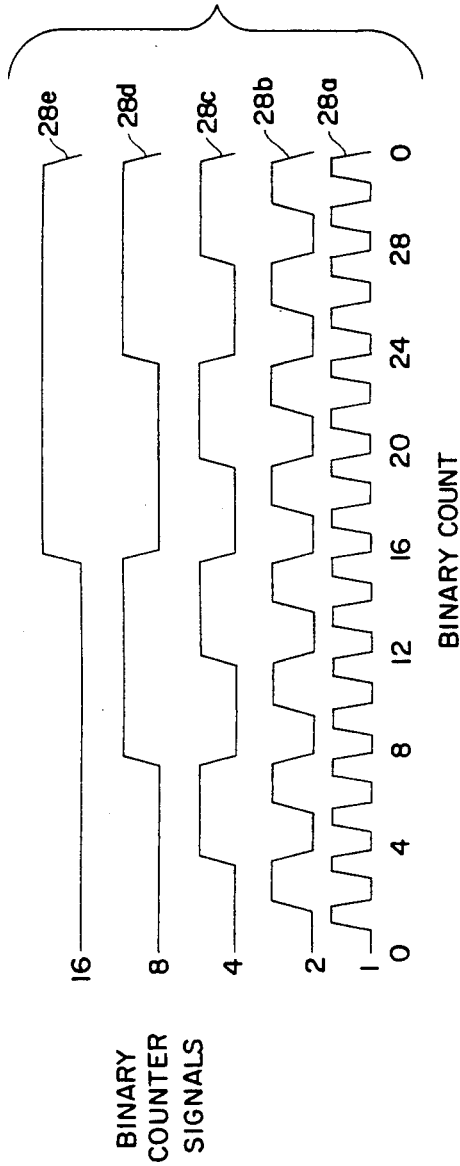
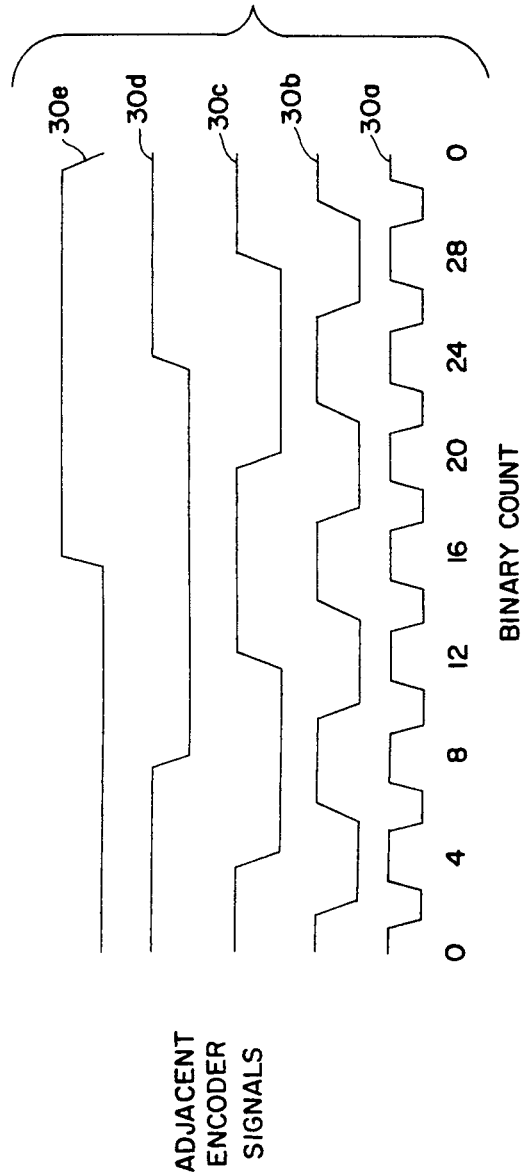

5,329,280

ADJACENT CODE SYSTEM

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

(1) Field of the Invention

The present invention relates to an adjacent code system and more particularly to a system in which the output signal of a binary counter appears at the output of a decoder that has a selected line for each state of the binary counter. As part of the operation of the system the output signal of the binary counter is converted to an adjacent code. An adjacent code can be defined as any code that produces only one bit change for each successive state change in a counting sequence. The conversion to an adjacent code takes place in the present invention to enable the output signal of the binary counter to be presented without "glitches" at the output of the decoder. The term "glitches" will be explained later.

(2) Description of the Prior Art

Digital counters are widely used in present-day circuit applications for a variety of functions. For example, they are frequently used for scanning keyboards and switch matrices. They are used to scan output displays, such as the well-known seven-segment LED displays. They are also used for timing, for instance, in real time clocks and as baud rate generators in serial communications. Many other such applications also exist.

There are many codes that can be used to represent the states of a digital counter. In the case of standard binary systems, each state is assigned a unique string of binary digits, called bits. Each bit is either a logic "0" or a logic "1." One of the most common codes used is the "binary" code in which each number in a set of integers from "0" to "$2^n-1$" is expressed as a weighted sum of "n" bits and each bit is weighted according to its position in the string. The bit that is located at the farthest position to the right is called the least significant bit and has a weight of $2^0$. The next bit to the left has a weight of $2^1$. The weight increases by a factor of two with each successive bit. The bit that is farthest to the left is the most significant bit and has a weight of $2^{n-1}$.

A binary counter normally sequences through these binary codes in the ascending order of their equivalent numbers. Some binary counters operate in descending order. While the binary code can be efficiently implemented in counters, this approach has the disadvantage of producing glitches when the output of such a counter is decoded.

Decoding is the process of identifying which state a counter is in, i.e., its present value. This process often means the assigning of one output line of the decoder to each state of the counter. The condition of this output line signifies whether or not the counter is in the state assigned to that line. There are many ways to do this. Some counters are self-decoding; in that case, each output line of the counter corresponds to a different state. Other counters require additional combinations of logic to decode their states. For counters requiring decoding, the use of only combinational logic for decoding may result in decoding glitches.

The errors called "glitches" consist of unwanted, narrow pulses that appear in the output of a logic gate. They occur when two or more inputs to a gate are intended to change simultaneously, but fail to do so. The gate output may change once when the first input changes and again when subsequent inputs change. For instance, when going from one to two in binary, the change is from 01 to 10. If on a counter the second bit changes prior to the first bit, the output goes from 01 to 00 to 10. If the first bit changes prior to the second bit the output goes from 01 to 11 to 10. The intermediate states formed at the output of a logic gate are undesirable narrow pulses called glitches. In this way, multiple output changes can take place when either none or one is desired. One way of avoiding such glitches in the decoding of counting systems is to use "adjacent" codes. As mentioned previously, an adjacent code has the property of requiring only one bit change for each successive state in a counting sequence. This property is significant, because it prevents glitches when the decoding of states takes place. This is because multiple input changes to the decoding gates cannot occur for any state change. Unfortunately, a binary code is not "adjacent" and decoding by using combinational logic will generally produce glitches.

This problem can be avoided by using sequential logic. One way is to decode the binary counter one state early for each state with combinational logic. This decoded state can then be latched simultaneously with the changing state of the counter. This is done by using a counter clock to serve also as the latching clock. The counter clock in such a case must have a frequency that is twice that of the "least significant" bit of the binary counter. In this way, the glitches output from the decoder are hidden by the latch without adding clocking delays to the decoder. The disadvantage of this solution is that a counter clock is required to latch the decoder outputs.

SUMMARY OF THE INVENTION

Accordingly, it is a general purpose and object of the present invention to provide a means for decoding the states of a binary counter while eliminating glitches.

It is a further object of the invention that such means is applicable without the need for additional control signals, such Sas a counter clock, which may not be readily available.

Another object is that such means is simple and rugged in design, is capable or being easily manufactured from readily-available materials, and is capable of a long life of useful service with a minimum of maintenance.

These objects are accomplished with the present invention by providing an apparatus in which a standard binary counter is connected to an adjacent encoder that results in only one output change for each successive state change of the binary counter. The outputs of the adjacent encoder are connected to the inputs of a state decoder containing only combinational logic. The outputs of the state decoder are free of glitches, due to the action of the adjacent encoder.

More specifically, the adjacent encoder includes a plurality of flip-flop devices of the positive, edge-triggered type to which the outputs of the binary counter are connected. The outputs from the adjacent encoder are connected to a binary decoder.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings wherein:

FIG. 3 shows the binary pulses at the output of the binary up-counter of FIG. 2; and FIG. 4 shows the signals received at the inputs of the binary decoder of FIG. 2.

DESCRIPTION OF THE PREFERRED EMBODIMENT

Figure 1:
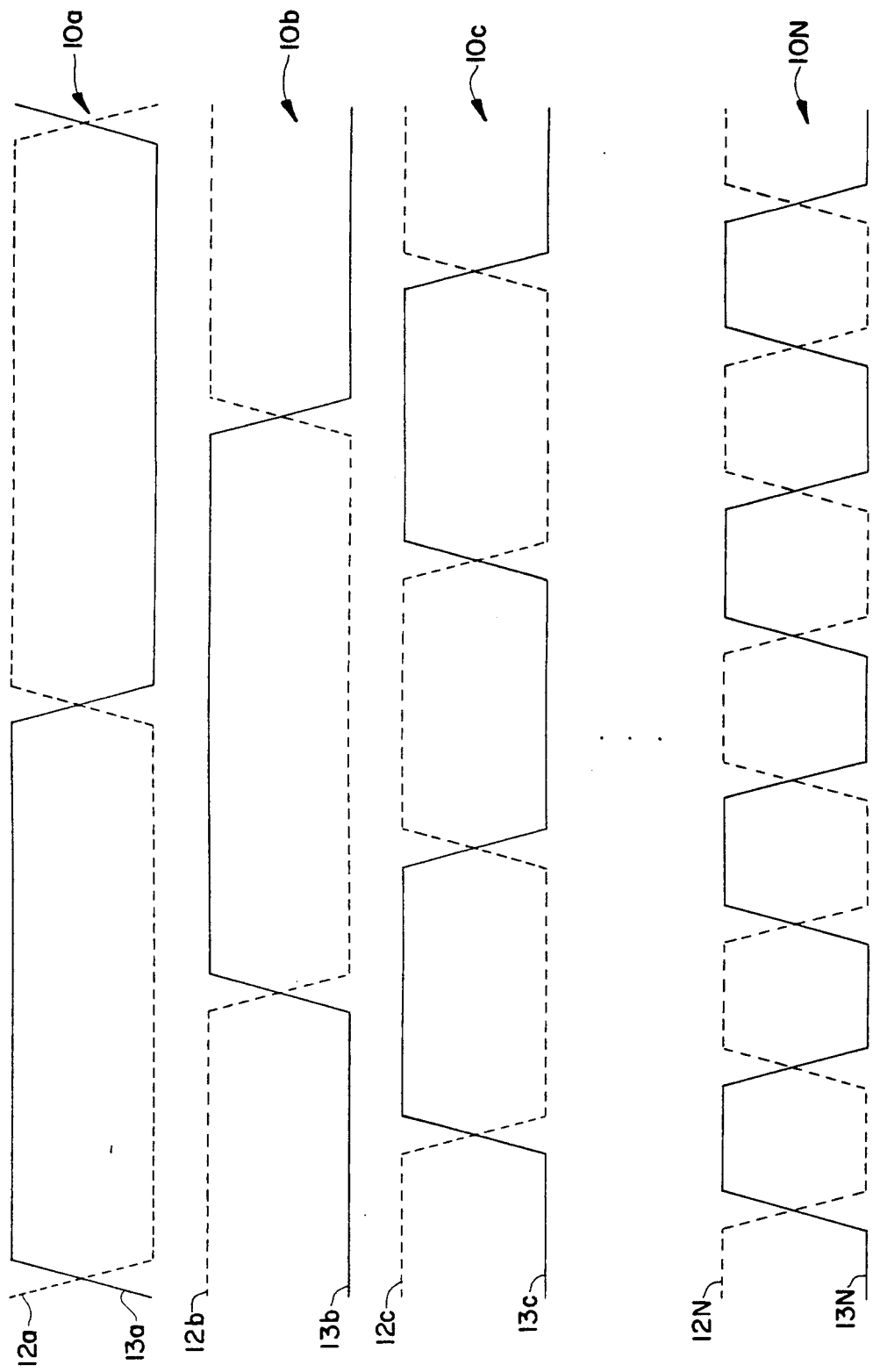
FIG. 1 is a graphical representation of the digital pulses encountered in/the practice of the invention.

Referring now to FIG. 1 there is shown a timing diagram for a $2^n$ state system. For such a system, there are n encoded signals. These signals are designated 10a through 10n. For each signal, one of the two complementary patterns shown must be chosen in order to define an adjacent code from this class. That is to say, either pattern 12a or 13a must be chosen, in conjunction with 12b or 13b, and along with 12c or 13c, etc. This process continues until 12n or 13n is chosen to complete the set. In FIG. 1, for simplicity sake, the 10n signal drawn is the signal following 10c and could be marked 10d.

This class of adjacent codes, shown in FIG. 1, is distinguishable by its transition points. The algorithm for defining the class is as follows: transitions of signal 10a occur at the two ends and at the half-way point of the counting cycle. Transitions of signal 10b occur half-way between the signal 10a transitions. Signal 10c transitions occur half-way between the signal 10a and 10b transitions. This process of dividing the intervals in half continues until signal 10n's transitions are defined. This division of time intervals in half assumes that all counting states are of equal duration. If this is not true, then "dividing in half" means dividing the number of counting states between the two transitions by two and then aligning the transition of the encoded signal being defined with the state transition that separates the first half of counter states from the second half.

The fact that all codes of the class are adjacent can be shown. To begin with, an adjacent code must have two properties. First, there must be one transition for each state change. The algorithm above assures this, because intervals are repeatedly divided in half, so that two transitions can never occur at the same time. Secondly, there must be a unique code for each state. An observation of 10a makes it clear that the code is divided into two disjoint sets. Looking at 10b, each of these disjoint sets is further divided into two disjoint sets. This process continues through 10n, where there are $2^n$ disjoint sets that contain one element, i.e., one unique code.

The conversion from a binary code to one of the adjacent codes shown in FIG. 2 can be accomplished as follows: use an n-bit binary counter with output signals B0 through B(n−1), where B0 is the "least significant" bit, while B(n−1) is the "most significant" bit. Now, let the adjacent coded signals be designated q0 through q(n−1), these being the specific versions of the general signals Q0 through Q(n−1), respectively. A delay operator D (x,y) is defined, where "x" is the number of states delayed and "y" is the signal being delayed. The following equations specify the conversion process:

$$q0 = D[0, B(n-1)]$$

$$q1 = D[2^{n-2}, B(n-1)]$$

$$q2 = D[2^{n-3}, B(n-2)]$$

$$q3 = D[2^{n-4}, B(n-3)]$$

$$\vdots$$

$$q(n-2) = D[2, B2]$$

$$q(n-1) = D[1, B1]$$

or, more compactly:

$$qi = S(n-1), i=0$$

$$qi = D[2^{n-1-i}, B(n-i)], i=1, n-1$$

Any one of the adjacent codes included in the class can be obtained by choosing a set of n signals Qj (j=0 through n−1), such that for each j, either qj or the one's complement of qj is used. This technique applies to down-counting binary counters as well as up-counting counters.

Decoding these adjacent states is straightforward and standard combinational logic techniques can be employed. One special case is when each decoded state requires its own output line. In that case, an n-line to $2^n$ line decoder can be used. This decoder can be the same circuit used to decode an n-bit binary counter. Only the assignment of output lines must change. A binary number R is converted to an adjacent code that has an equivalent binary value S. Thus, the output line used for S with a binary code is now used for R. All outputs are mapped in this manner. This mapping is done as follows: the kth number R(k) in an n-bit binary counting sequence is converted to a number S(k) in the adjacent counting sequence. R(k) is given by the equation:

$$R(k) = \sum_{j=0}^{N-1} 2^j r(j, k) \quad (1)$$

where $$r(j, k) = \frac{1 - (-1)^{INT\frac{(2n+k)}{2j}}}{2} \quad (2)$$

r(j,k) is the value of the jth bit in R(k), and INT means "the greatest integer less than."

Similarly, S(k) is given by the equation:

$$S(k) = \sum_{j=0}^{N-1} 2^j s(j, k) \quad (3)$$

where s(j,k) is the value of jth bit in S(k).

Assume that the adjacent code with only the uncomplemented signals (q0, q1, q2 . . . . . q(n−1)) is chosen. The following equations are used for converting binary code to this adjacent code, $$s(j, k) = \frac{1 - (-1)^{INT\frac{k}{2^{n-1}}}}{2}, j = 0 \quad (4)$$

-continued $$s(j, k) = \frac{1 - (-1)^{INT\frac{2^n - 2^{n-1} - j + k}{2^j}}}{2}, j = 1, n - 1 \quad (5)$$

From these equations, it is possible to calculate the binary value of the kth adjacent state, S(k), which corresponds to the kth binary coded state. Thus, the mapping from binary decoding to adjacent state decoding can be accomplished. The weights of the adjacent coded bits are arbitrary and can be changed around, if desired. This results in a different equivalent binary value of the adjacent code, although the code conversion hardware does not change.

If a different adjacent code from the one assumed is used, it is only necessary to replace s(j,k) by its one's complement, where appropriate. Thus, the present method of decoding, using equivalent binary states, can be used for all adjacent codes of the class.

Figure 2:
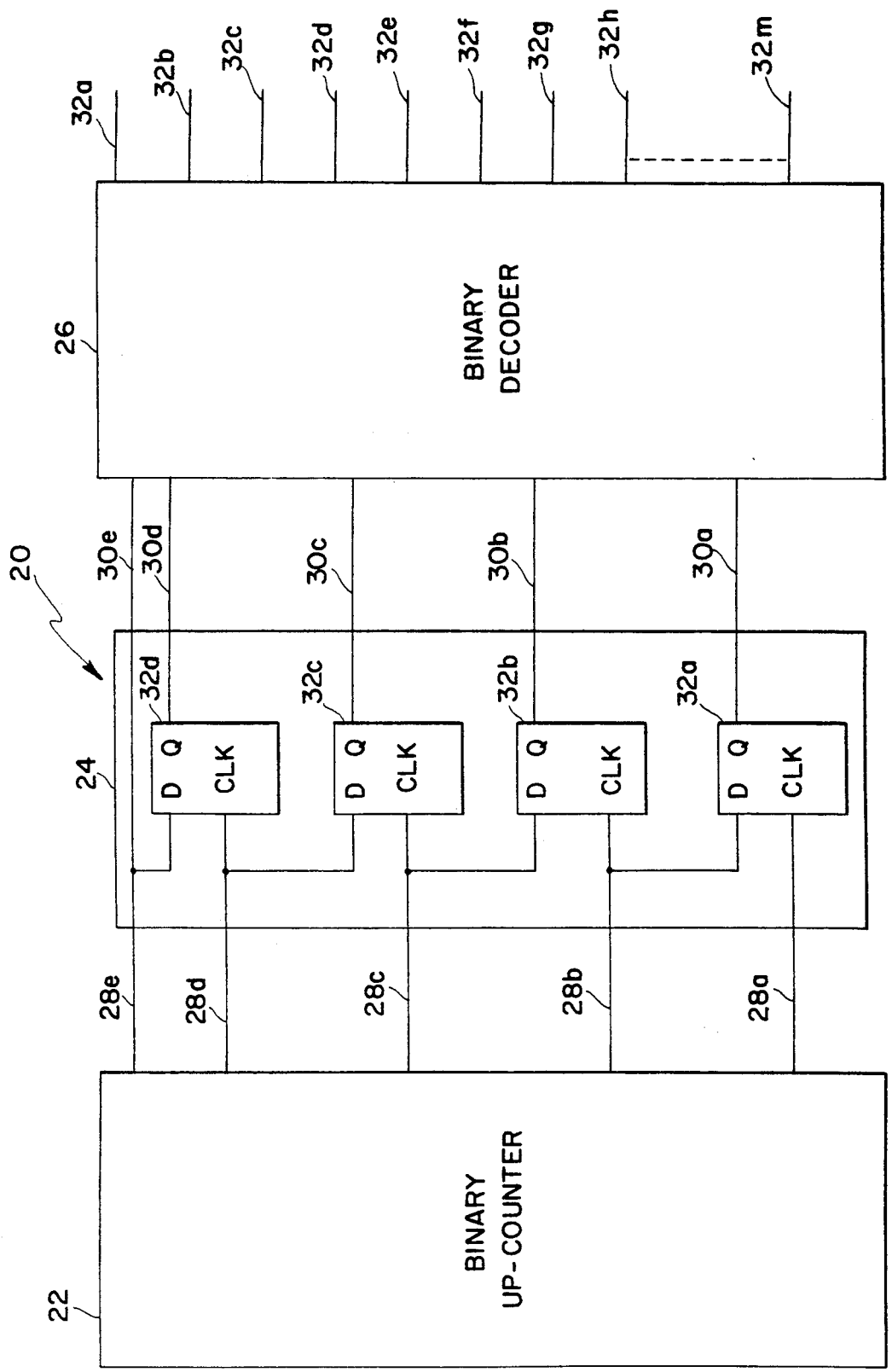
FIG. 2 is an electrical diagram of a adjacent code system embodying the principles of the present invention.

Refer now to FIG. 2. For ease of understanding the system 20, in the following description a 5-bit binary counter 22 is used. It is to be understood that the binary counter 22 can have any number of n-bits with the size of the adjacent encoder 24 and line binary decoder 26 corresponding to the size of the binary counter 22 used.

The system 20 comprises a 5-bit binary up-counter 22 connected to an adjacent encoder 24 that provides a 5-line input to a $2^5$ line output binary decoder 26. Binary counter signals 28a through 28e are generated by the binary counter 22 and enter adjacent encoder 24. The binary counter 22 output signals are shown in FIG. 3 wherein signal 28a has a value of $2^0$, signal 28b has a value of $2^1$, signal 28c has a value of $2^2$, signal 28d has a value of $2^3$ and signal 28e has a value of $2^4$.

Adjacent signals 30a-30e are generated by the adjacent encoder 24 from the binary signals 28a-28e. The adjacent encoder 24 comprises four D-type flip flops 32a-d. Adjacent signals 30a-30e enter the decoder 26 where they are decoded into signals 32a-32m (m=$2^5$).

In operation, binary counter signal 28e, of a value 24, enters adjacent encoder 24 and is passed through unchanged to become adjacent signal 30e. All adjacent encoder signals 30a-30e are shown in FIG. 4 and listed in Table 1 below. In the following operational description and Table 1 below HIGH and H are synonymous with the value "1," and LOW and L are synonymous with the value "0."

Binary counter signal 28e also enters the D input of a D-flip-flop 32d that is triggered by the positive edge of a signal on its CLK input Binary counter signal 28d, of a value $2^3$, provides the CLK input of flip-flop 32d. Binary signal 28e is latched into flip-flop 32d on the rising edge of the binary counter signal 28d. The rising edge of the binary counter signal 28d passes the binary counter signal 28e that appears at that time, through flip-flop 32d to provide the output adjacent signal 30d.

Observing FIGS. 3 and 4 for the above operation, it can be seen, that at the binary count of eight, signal 28d goes HIGH and therefore passes the LOW signal on 28e to become LOW adjacent signal 30d. Signal 30d remains LOW until the binary count reaches 24. Then signal 28d goes HIGH and passes the HIGH signal 28e to become HIGH adjacent signal 30d. Signal 30d remains HIGH until the binary counter again reaches 8. The signal 28d goes HIGH and passes the LOW signal 28e to become LOW adjacent signal 30d.

Now refer to FIGS. 2, 3, and 4 for the operation of flip-flop 32c. Binary counter signal 28d enters the D input of flip-flop 32c that is triggered by the positive edge of a signal on its CLK input. Binary counter signal 28c, of a value 22, provides the CLK input of flip-flop 32c. Binary signal 28d is latched into flip-flop 32c on the rising edge of the binary counter signal 28c. The rising edge of the binary counter signal 28c passes the binary counter signal 28d that appears at that time, through flip-flop 32c to provide the output adjacent signal 30c.

Observing FIGS. 3 and 4 for the above operation, it can be seen, that at the binary count of four, signal 28c goes HIGH and therefore passes the LOW signal on 28d to become LOW adjacent signal 30c. Signal 30c remains LOW until the binary count reaches 12. Then signal 28c goes HIGH and passes the HIGH signal 28d to become HIGH adjacent signal 30c. As can be seen, change in the adjacent signal 30c again takes place when signal 28c goes HIGH at binary counts 20 and 28.

The operations of flip-flops 32b and 32a for providing adjacent signals 30b and 30a can be explained in the same manner as flip-flops 32d and 32c. The complete listing of adjacent signals 30a-30e is given in Table 1.

TABLE 1

| Binary Input Value | Adjacent Encoder Input and Output | | | | | Binary Input Value | | | | | |
|---|---|---|---|---|---|---|---|---|---|---|---|
| | Output | | | | | | Output | | | | |
| | 30e | 30d | 30c | 30b | 30a | | 30e | 30d | 30c | 30b | 30a |
| 0 | L | H | H | H | H | 16 | H | L | H | H | H |
| 1 | L | H | H | H | L | 17 | H | L | H | H | L |
| 2 | L | H | H | L | L | 18 | H | L | H | L | L |
| 3 | L | H | H | L | H | 19 | H | L | H | L | H |
| 4 | L | H | L | L | H | 20 | H | L | L | L | H |
| 5 | L | H | L | L | L | 21 | H | L | L | L | L |
| 6 | L | H | L | H | L | 22 | H | L | L | H | L |
| 7 | L | H | L | H | H | 23 | H | L | L | H | H |
| 8 | L | L | L | H | H | 24 | H | H | L | H | H |
| 9 | L | L | L | H | L | 25 | H | H | L | H | L |
| 10 | L | L | L | L | L | 26 | H | H | L | L | L |
| 11 | L | L | L | L | H | 27 | H | H | L | L | H |
| 12 | L | L | H | L | H | 28 | H | H | H | L | H |
| 13 | L | L | H | L | L | 29 | H | H | H | L | L |
| 14 | L | L | H | H | L | 30 | H | H | H | H | L |
| 15 | L | L | H | H | H | 31 | H | H | H | H | H |

The binary decoder 26 outputs one asserted line for each state of its inputs. When inputs to the decoder 26 have a binary coded value of S(k), the output line corresponding to that number is asserted. This occurs when the binary counter has a value of R(k) corresponding to the output S(k) of the encoder. The relationship between S and R for the kth state in the sequence is given by equations (1) to (4).

If the binary decoder 26 is of the type that can be directly connected to binary counter 22 then the internal wiring of the binary decoder 26 must be switched so that the signals from the adjacent encoder 24 appear on the correct outputs. An alternative would be to simply recognize that the outputs of the decoder 26 are different than they would be if the binary decoder 26 were directly connected to the binary counter 22.

The advantages of the present invention will now be readily understood in view of the above description. One advantage is that it does not require a separate clock signal. This is important if the counter is a large-scale integrated chip, such as a microcontroller, where a clock signal may not be available. Another advantage is that each binary signal need only drive a maximum of two inputs. This is true no matter how many binary coded signals there are. Thus, the counter normally would not require buffering of its output signals in order to provide the necessary drive capability. One further advantage, of the many advantages present is that the binary counter can be oversized. Additional bit outputs, of the counter would not need to be connected for a smooth operation of the system. Regardless of the number of bits on the counter, if n bits are required for operation, then only n-1 D-type flip-flops are needed.

It will be understood that various changes in the details, materials, steps and arrangement of parts, which have been herein described and illustrated in order to explain the nature of the invention, may be made by those skilled in the art within the principle and scope of the invention as expressed in the appended claims.

What is claimed is:

1. An adjacent code system comprising:
 a binary counter having a plurality of outputs for providing binary counter bit output signals;
 an adjacent code encoder including a plurality of flip-flop devices, each of said plurality of flip-flop devices having inputs connected to receive signals from selected outputs of said binary counter, each of said flip-flop devices having an output for providing a signal that is a portion of an adjacent code signal, said flip-flop outputs together with the most significant bit output from said binary counter providing adjacent code signals; and
 a binary decoder having inputs to which said adjacent code signals are connected and said binary decoder having a plurality of outputs with each of said outputs providing a signal in response to a different binary counter bit output signal than any other of said outputs.

2. An adjacent code system according to claim 1 wherein said flip-flop devices are of the D-type, positive, edge-triggered type.

3. An adjacent code system according to claim 2 wherein each of said flip-flop devices has a D and a CLK input, each of said D inputs being connected to a different member of said binary counter outputs with all of said binary counter outputs being utilized except the least significant bit output, each of said clock inputs being connected to a different member of said binary counter outputs with all of said binary counter outputs being utilized except the most significant bit output, and each of said flip-flop devices having its D input connected to a binary counter output of one significant bit more than its CLK input.

4. An adjacent code system according to claim 3 wherein said number of flip-flops is one less than said number of binary counter outputs utilized.

5. A system for providing adjacent code signals comprising:
 a binary counter having a plurality of outputs for providing binary counter bit output signals; and
 an adjacent code encoder including a plurality of flip-flop devices, each of said plurality of flip-flop devices having inputs connected to receive signals from selected outputs of said binary counter, each of said flip-flop devices having an output for providing a signal that is a portion of an adjacent code signal, said flip-flop outputs together with the most significant bit output from said binary counter providing adjacent code signals.

6. A system for providing adjacent code signals according to claim 5 wherein said flip-flop devices are of the D-type, positive, edge-triggered type.

7. A system for providing adjacent code signals according to claim 6 wherein each of said flip-flop devices has a D and a CLK input, each of said D inputs being connected to a different member of said binary counter outputs with all of said binary counter outputs being utilized except the least significant bit output, each of said clock inputs being connected to a different member of said binary counter outputs with all of said binary counter outputs being utilized except the most significant bit output, and each of said flip-flop devices having its D input connected to a binary counter output of one significant bit more than its CLK input.

8. A system for providing an adjacent code signals according to claim 7 wherein said number of flip-flops is one less than said number of binary counter outputs utilized.

* * * * *